United States Patent
Bae et al.

(10) Patent No.: US 6,329,106 B1
(45) Date of Patent: Dec. 11, 2001

(54) REPAIR METHOD FOR PHASE SHIFT MASK IN SEMICONDUCTOR DEVICE

(75) Inventors: Sang Man Bae; Yong Chul Shin; Young Mo Koo, all of Seoul; Kwang Yoon Koh, Kyoungki-do; Bong Ho Kim; Dong Jun Ahn, both of Seoul, all of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/393,868

(22) Filed: Sep. 10, 1999

(30) Foreign Application Priority Data

Apr. 27, 1999 (KR) .................................................. 99-14988

(51) Int. Cl.⁷ .............................. G03F 9/00; C23C 14/00; C23C 14/32; C03C 15/00
(52) U.S. Cl. ............................ 430/5; 204/192.34; 216/66
(58) Field of Search ................................ 430/5, 322, 323; 204/192.34, 192.35; 216/65, 66

(56) References Cited

U.S. PATENT DOCUMENTS

| | | | |
|---|---|---|---|
| 4,906,326 | 3/1990 | Amemiya et al. | 156/626 |
| 5,035,787 | 7/1991 | Parker et al. | 204/192 |
| 5,165,954 | 11/1992 | Parker et al. | 427/526 |
| 5,273,849 | 12/1993 | Harriott et al. | 430/5 |
| 5,521,032 | 5/1996 | Imai et al. | 430/5 |
| 5,582,939 | 12/1996 | Pierrat | 430/5 |
| 5,795,685 | 8/1998 | Liebmann et al. | 430/5 |
| 5,807,650 | * 9/1998 | Komano et al. | 430/5 |
| 6,090,507 | * 7/2000 | Grenon et al. | 430/5 |
| 6,165,649 | * 12/2000 | Grenon et al. | 430/5 |

FOREIGN PATENT DOCUMENTS

| | | | |
|---|---|---|---|
| 6085525 | 5/1985 | (JP) | H01L/21/30 |
| 61123843 | 6/1986 | (JP) | G03F/1/00 |

\* cited by examiner

*Primary Examiner*—S. Rosasco
(74) *Attorney, Agent, or Firm*—Ladas & Parry

(57) ABSTRACT

The present invention is directed to prevent generating repair by-products during a repair process of a phase shift mask, and defects on a quartz substrate.

According to the present invention, a repair method for phase shift mask in a semiconductor device so as to remove a bridge formed between a phase shift layer on a quartz substrate, comprises the steps of: first repairing the bridge by implanting a charging ion according to a focused ion beam- ("FIB") method; and second repairing the first repaired bridge portion by emitting laser and then removing the bridge.

9 Claims, 7 Drawing Sheets

REPAIR METHOD FOR PHASE SHIFT MASK IN SEMICONDUCTOR DEVICE

FIELD OF INVENTION

The present invention relates to a repair method for phase shift mask in a semiconductor device, and more particularly to a repair method for half-tone phase shift mask in a semiconductor device.

BACKGROUND OF THE INVENTION

The half-tone phase shift mask has been used in the photolithography process having high resolution so as to fabricate a fine contact hole or a fine patterning. Especially, when an i-line exposure equipment is used in the process, a phase shift layer provided to the half-tone phase shift mask is formed of a material such as MoSi, MoSiN or MoSiON that transmits approximately 4~12% of light and shifts phase of the light.

FIG. 1 is a cross-sectional view showing a general half-tone phase shift mask.

Referring to FIG. 1, a phase shift layer 13 that transmits approximately 4~12% of light and shifts phase of the light by 180°, is formed on a quartz substrate 11. The phase shift layer 13 is formed of one selected among MoSi, MoSiN and MoSiON, and with thickness of approximately 1,000~1,400A. The phase shift layer 13 is partially patterned so as to act as a contact hole or a pattern mask. At this time, an E-beam writing method is applied to patterning of the phase shift layer 13.

However, as shown in FIG. 2, a bridge 15 occurs as a phase shift layer at an unwanted region during patterning the phase shift layer 13. The bridge 15 is removed by the following methods.

Firstly, the bridge 15 can be removed by a focused ion beam (hereinafter "FIB") method. According to this method, Ga ions ($Ga^+$) having high energy, i.e. 50~100 KeV are implanted to the bridge 15, thereby to drop off the bridge 15 from the quartz substrate 11.

On the other hand, the second repairing method uses a blue laser having long wavelength. A laser having wavelength of approximately 488 nm is applied to the bridge 15, and then the bridge 15 is welded and removed.

However, the following problems occurred in a repair process using the FIB device. Since the FIB repair method is generally applied to Cr mask, it is difficult to remove the bridge made of the phase shift layer having a property of matter, which is different from that of Cr. In other words, the phase shift layer such as MoSi, MoSiN and MoSiON has a stronger bonding force than that of Cr. Therefore, it takes many hours to remove the bridge 15. As a result, referring to FIGS. 4 and 5, residues 15a remain of the bridge 15 and also repair by-products 16 formed around the residue 15a even after a selected time is passed. Herein, the by-products 16 is formed by a reaction between Ga Ions, i.e. ion source of the FIB repair and Si ions, one component of the phase shift layer which comprises the bridge 15 having excellent reactivity with respect to Ga ions. The repair by-products 16 are not easy to remove by the FIB repair method.

Furthermore, if the FIB repair process is performed for a long time to remove the residue 15a of the bridge completely, the Ga ions ($Ga^+$) having high energy are continuously focused at the quartz substrate 11 of the outside of the bridge 15 or the repair by-products 15a. As shown in FIG. 6, the Ga ions ($Ga^+$) having high energy are continuously focused on a surface of the quartz substrate 11, thereby pitting some portions (H) of the quartz substrate 11.

Moreover, if the FIB repair process is performed for a long time, the Ga ions ($Ga^+$) having high energy may permeate inside the quartz substrate 11 with high energy, then the Ga ion ($Ga^+$) functions as a mask. Therefore, a defect occurs in the pattern on semiconductor substrate.

In the meantime, a method by emitting the blue laser has low accuracy during the repair process since a laser has its inherent characteristic of diffraction. Therefore, edges of repaired portions are removed ununiformly. Thus, if the repaired portions are not removed uniformly, it is difficult to use them as masks for forming a high resolution pattern. Since the phase shift layer as mentioned previously has a strong bonding force, powerful energy and long time are required to remove the bridge by the blue laser.

SUMMARY OF THE INVENTION

Accordingly, it is one object of the present invention to prevent generation of the repair by-products during the repair process of the phase shift layer.

It is another object of the present invention to prevent defects on the quartz substrate during the repair process of the phase shift layer.

It is further an object of the present invention to repair only a portion to be removed.

It is still one object of the present invention to repair defected portions on the phase shift mask in a short time.

To accomplish the above objects, the present invention provides a repair method for phase shift mask in a semiconductor device so as to remove a bridge formed between a phase shift layer on a quartz substrate, comprising the steps of: first repairing the bridge by implanting a charging ion according to a focused ion beam ("FIB") method; and second repairing the first repaired bridge portion by emitting laser and then removing the bridge.

Herein, in the step of first repairing the bridge, the charging ion is Ga ion ($Ga^+$) and the laser is a blue laser. In the step of first repairing the bridge, the Ga ions ($Ga^+$) are implanted such that the cohesion property of the entire bridge is weakened. The Ga ions ($Ga^+$) are implanted by energy of approximately 25~35 KeV with beam current of approximately 45~55 pA and ion concentration of $10^{15}$~$2 \times 10^{15}$ ions/$cm^2$.

Further, the bridge is first repaired so that the bridge is divided in the shape of a lattice. In the step of first repairing the bridge, a boundary between the phase shift layer and the bridge is repaired. A line width of the first repaired portion is preferably shown as an integral number times of the minimum line width repairable by the FIB device. The Ga ions ($Ga^+$) are implanted with a relatively high energy of 140~150 pA.

According to another embodiment of the present invention, a repair method for phase shift mask in a semiconductor device so as to remove a bridge formed between a phase shift layer on a quartz substrate, comprises the steps of: first repairing the bridge by emitting a blue laser to a center of the bridge; and second repairing the first repaired bridge portion by implanting a charging ion according to a focused ion beam ("FIB") method.

Herein, the laser used in the step of first repairing the bridge is a blue laser, and the charging ion used in the step of second repairing the bridge is Ga ion ($Ga^+$). In the step of second repairing the bridge, the Ga ions ($Ga^+$) are implanted with energy of 20~40 KeV.

DETAILED DESCRIPTION OF THE PREFERRED EMBODIMENT

Hereinafter, preferred embodiments of the present invention will now be made with reference to attached drawings.

FIGS. 7A to 7D are cross-sectional views showing a repair method of a phase shift mask of a semiconductor device according to one embodiment of the present invention.

Figure 1:
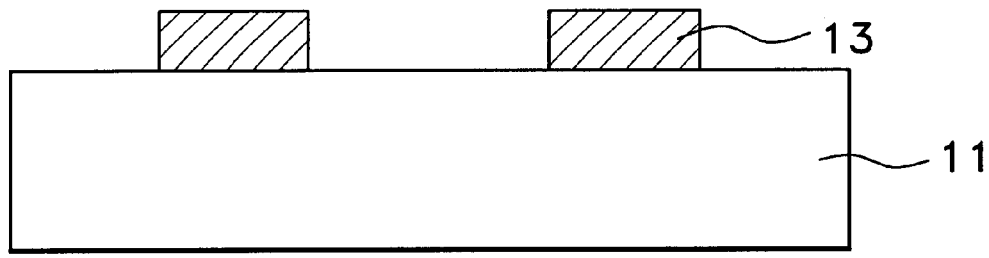
FIG. 1 is a cross-sectional view showing a conventional phase shift mask.
Figure 2:
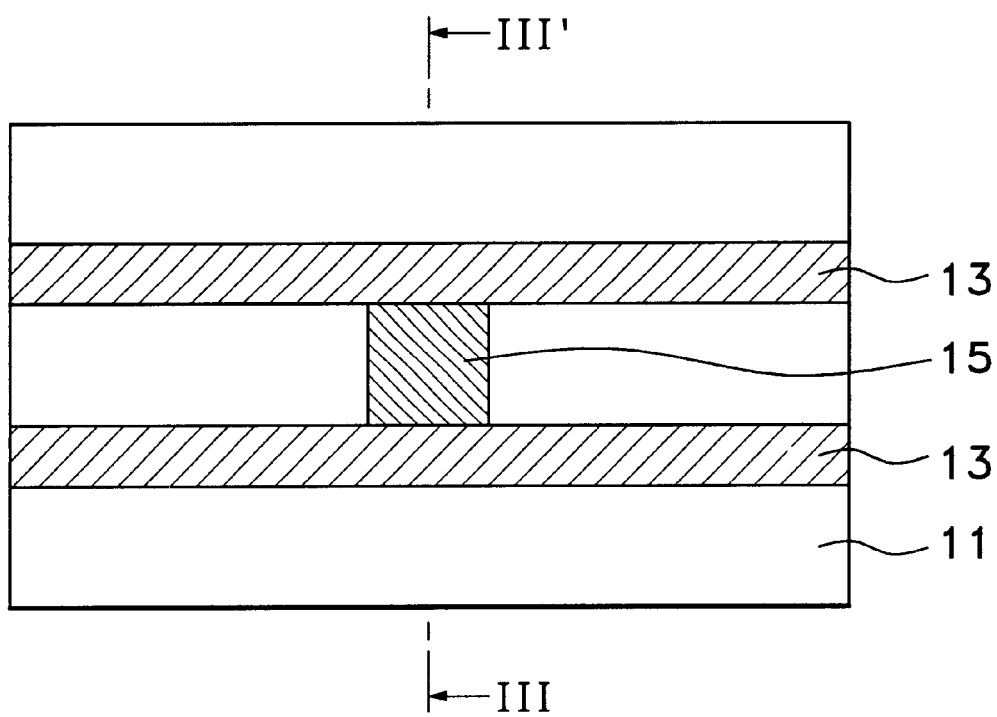
FIG. 2 is a plan view illustrating the conventional phase shift mask in which a bridge is formed.
Figure 3:
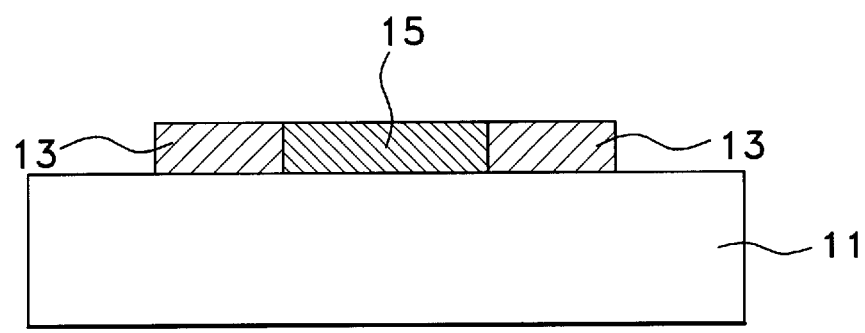
FIG. 3 is a cross-sectional view taken along the line III–III' of FIG. 2.
Figure 4:
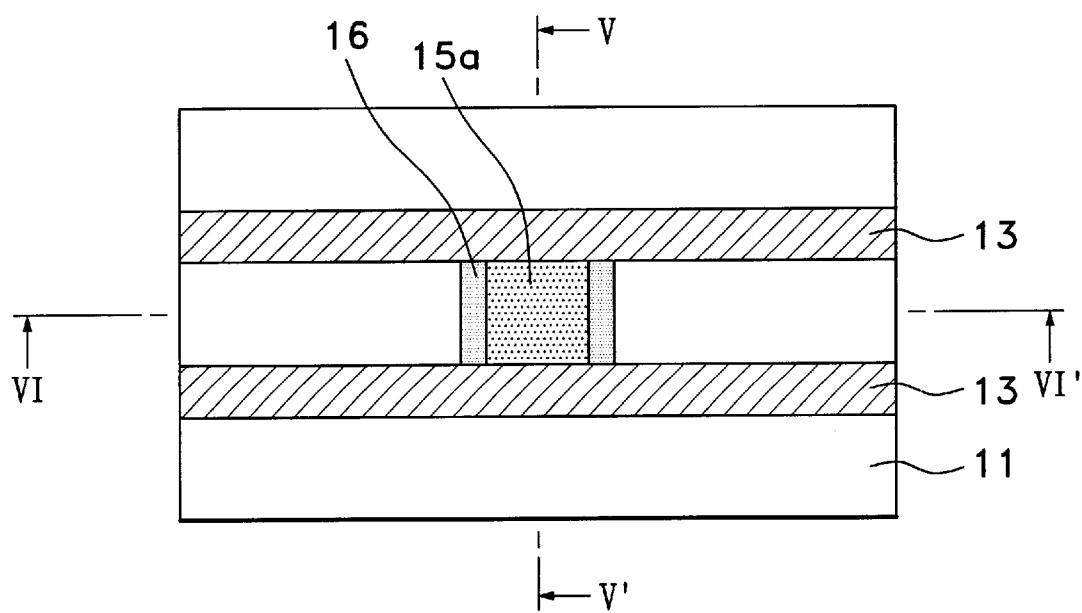
FIG. 4 is a plan view illustrating the conventional phase shift mask after a convention method of repair process is performed.
Figure 5:
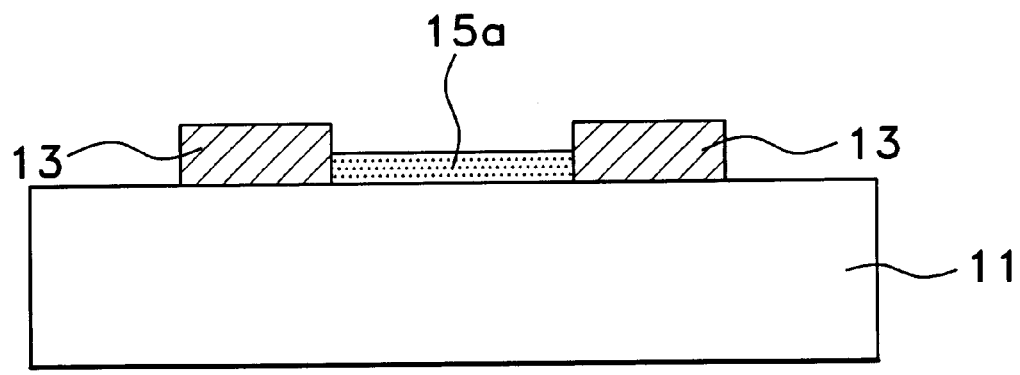
FIGS. 5 and 6 are a cross-sectional view taken along the line VI–VI' of FIG. 4.
Figure 6:
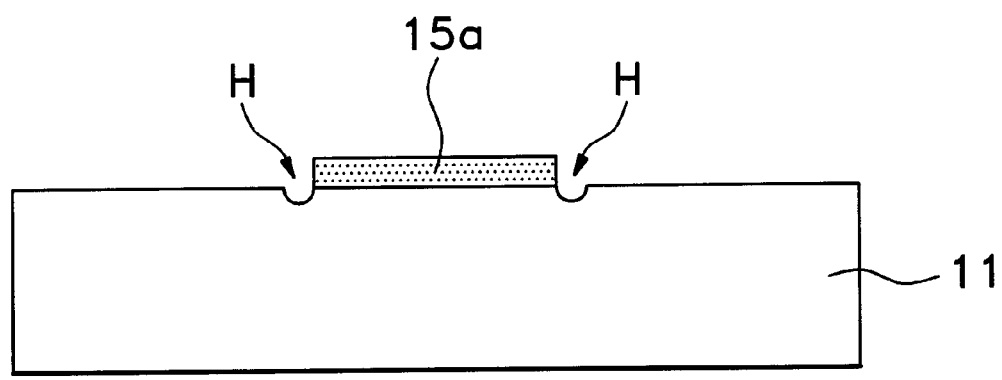
Figure 7A:
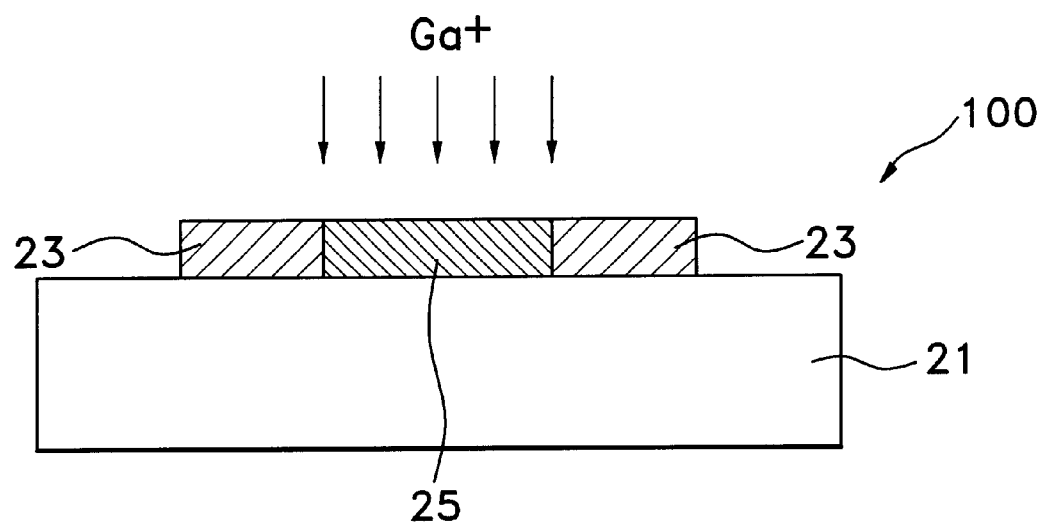
FIGS. 7A to 7D are cross-sectional views showing a repair method of phase shift mask of a semiconductor device according to one embodiment of the present invention.

Referring to FIG. 7A, a half-tone phase shift layer 23 is formed on a quartz substrate 21 by thickness of approximately 1000~1400 Å. A phase shift layer 23 is made of a material such as, for example MoSiN, MoSi or MoSiON which shifts light incident to the phase shift layer 23 by 180 degrees and simultaneously transmits 4~12% of the incident light. The phase shift layer 23 is patterned according to an E-beam writing method so that the phase shift layer 23 may define fine contact holes and a fine pattern. By doing so, a phase shift mask 100 is completed. At this time, a bridge 25 may be formed at a selected portion between the patterned phase shift layer 23.

The bridge 25 in this embodiment is removed as follows.

First, according to the FIB repair method, Ga ions (Ga$^+$) are implanted to the bridge 25 thereby weakening bonding force of components consisting the bridge 25. This FIB repair process is performed merely to weaken the bonding force of the bridge 25, therefore it is required to perform this process in a shorter time than the conventional process by using Ga ions (Ga$^+$) having lower energy. Herein, the Ga ions (Ga$^+$) used in the FIB repair process have a relatively lower energy of approximately 25~35 KeV with beam current of approximately 25~55 pA and ion concentration of $10^{15}$~$2\times10^{15}$ ions/cm$^2$.

Figure 7B:
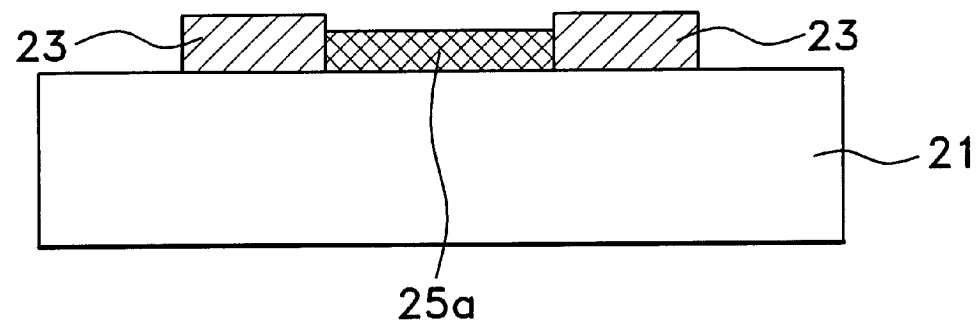

Thus, when the FIB repair process is performed as shown in FIG. 7B, a very little portion of the bridge 25 is removed and the bonding force of a remaining bridge portion 25a is very weak. At this time, there is formed a definite boundary between the bridge 25a having weakened bonding force and the phase shift layer 23 since the first repair process is performed according to the FIB repair method with excellent accuracy.

Figure 7C:
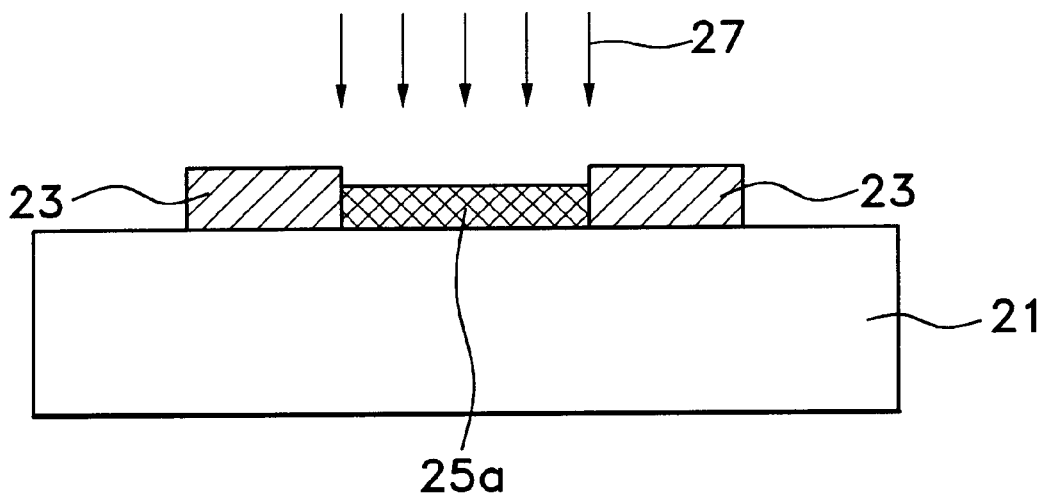
Figure 7D:
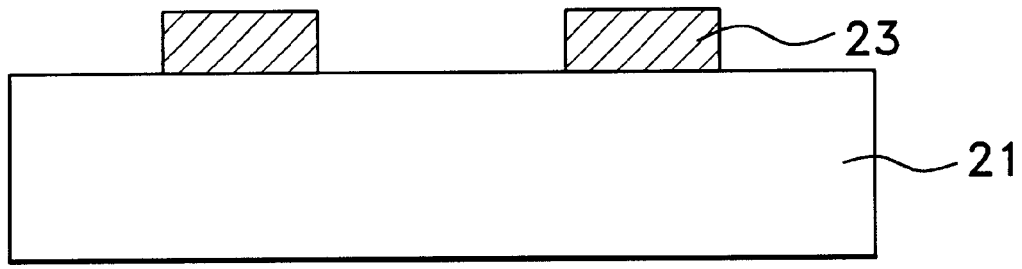

Next, as shown in FIG. 7C, a laser for example a blue laser 27 having wage length of 400~500 nm is emitted to the bridge 25a having weakened bonding force. Then, the bridge 25a whose bonding force is already weakened by the FIB repair process, is easily removed by the blue laser beam 27. At this time, as shown in FIG. 7D, the bridge 25a is completely removed from the phase shift layer 23 without leaving any residue since the definite boundary is formed according to the previous FIB repair process. Also, there is no effect on the quarts substrate 11 during the FIB repair process since such a powerful energy and a long process time required in the conventional process are not required in the present embodiment.

Figure 8A:
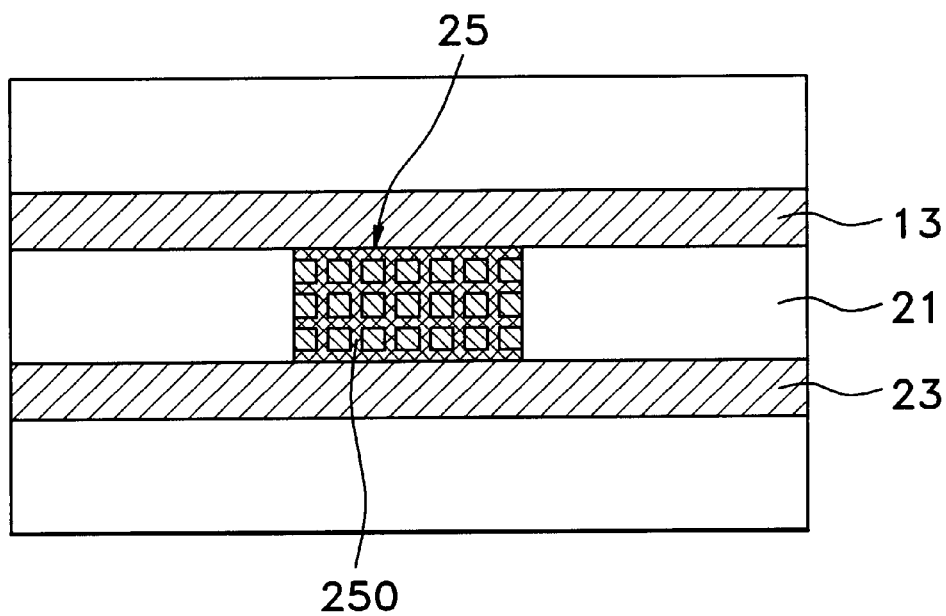
FIGS. 8A to 8B are plan views showing a phase shift mask according to another embodiment of the present invention.
Figure 8B:
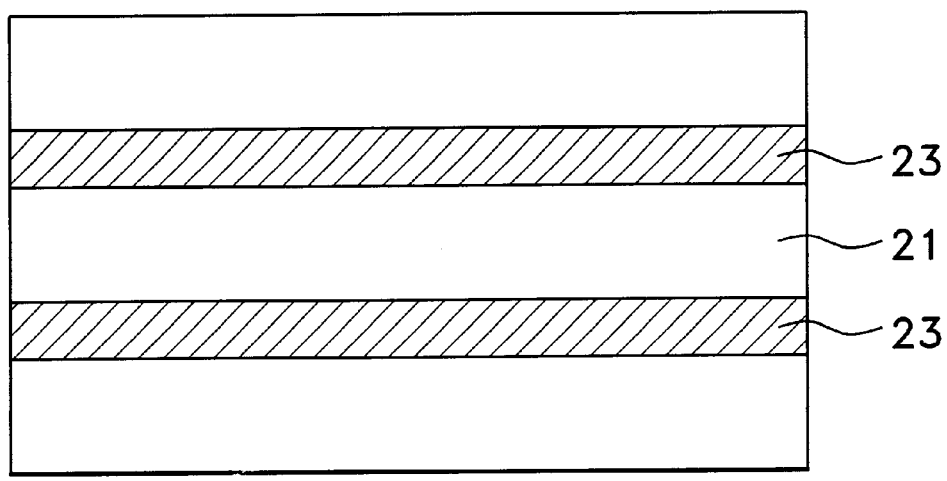

FIGS. 8A to 8B are plan views showing a phase shift layer according to another embodiment of the present invention.

Referring to FIG. 8A, similar to the first embodiment, a bridge 25 is first repaired according to the FIB repair method. In general, the FIB repair method is used to emit an ion beam to a wanted portion. By taking this advantage, the ion beam is not emitted to the entire bridge 25, but emitted to selected portions so that the bridge is divided into a shape of a lattice during the FIB repair process. At this time, a line width of the lattice portion to which the ion beam is emitted, is preferably shown as an integral number times of the minimum line width, approximately 0.312 μm which is the minimum width repairable by the FIB repair method. Furthermore, during the FIB repair process, a boundary between the phase shift layer 23 and the bridge 25 is repaired in order to make a definite boundary. However, a boundary between the quartz substrate 21 and the bridge 25 is not repaired by the FIB repair process so as to prevent defects on the quartz substrate 21. In this FIB repair process, Ga ion (Ga$^+$) having high energy of approximately 140~150 pA is used. As the FIB repair process is performed to divide the bridge 25 into a shape of the lattice, repaired portions 250 are partially removed or bonding force thereof is weakened such that the repaired portions 250 are easy to remove. Furthermore, other bridge portions not repaired have an unstable state by the FIB repaired portions 250.

Next, as shown in FIG. 8B, the blue laser is emitted to the bridge 25, thereby second repairing the bridge 25. By emitting the blue laser, the FIB repaired portions 250 are easily removed and its adjoining portions of the bridge 25 are also easily removed. Since a portion between the bridge 25 and the phase shift layer 23 is repaired during the first FIB repair process, residue is not formed between phase shift layer 23 when the blue laser is emitted therebetween.

Figure 9:
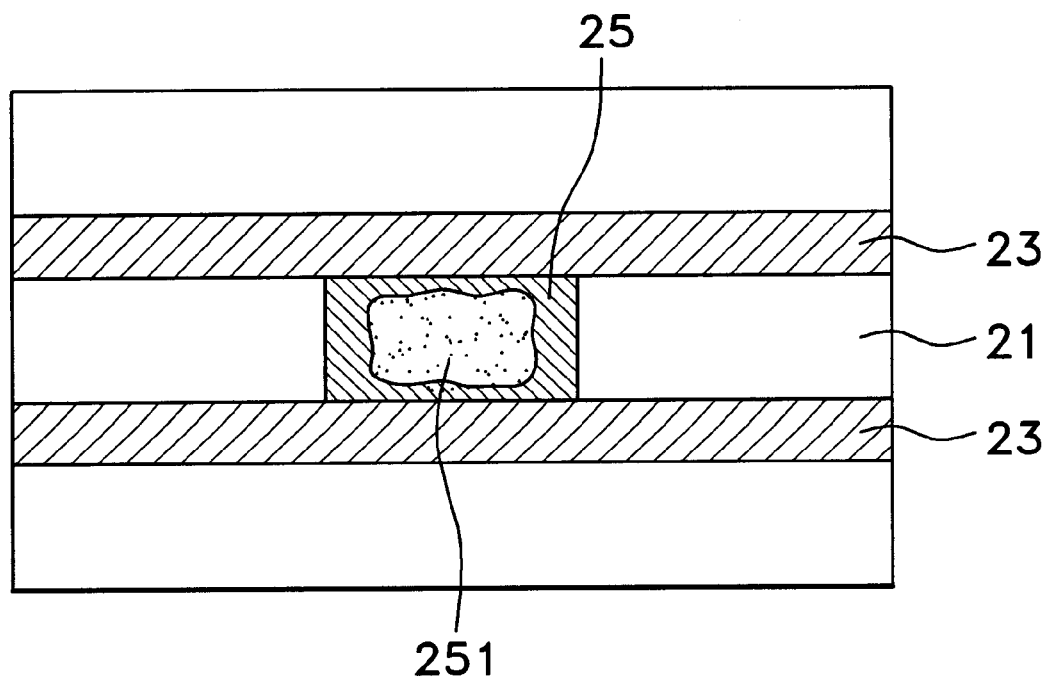
FIG. 9 is a plan view showing a phase shift mask according to still another embodiment of the present invention.

FIG. 9 is a plan view of a phase shift layer showing still another embodiment of the present invention.

First of all, referring to FIG. 9, the blue laser is emitted to a center of a bridge 25 in a phase shift mask. At this time, the blue laser is emitted only to the center of the bridge 25 since the laser beam repair method as low accuracy at a boundary between the bridge 25 and the phase shift layer 23. The reference numeral 251 stands for a portion to which the laser is emitted. Herein, the bridge 25 in the portion 251 to which the blue laser is emitted, is almost removed or remains with weakened bonding force.

Next, the remaining edge bridge 25 is removed by the FIB repair process. Since the portion 251 remains with weakened bonding force, the center of the bridge is removed and the edge of the bridge 25 is repaired simultaneously. Furthermore, the edge of the bridge 25 is removed by the FIB repair process having excellent edge removing property, therefore no residue is left at the boundary of the phase shift layer 13. Also, only the edge is removed by the FIB repair process, and Ga ions (Ga+) are implanted to the quartz substrate 21 at a relatively low energy of, for example 20~40 KeV thereby minimizing defects on the quartz substrate 21.

As described and discussed in the above specification, according to the present invention, when a bridge made of the same material used in the phase shift layer of the half tone phase shift mask happens, this bridge portion is removed by performing the FIB repair method together with the blue laser repair method. As a result, defects on the quartz substrate can be prevented since the FIB repair process is performed for a short time that does not cause any defect on the quartz substrate. Further, a portion which is first repaired by the FIB repair process, is secondly repaired by emitting the laser thereby removing the bridge easier. Also, a splatter problem which is caused when the laser repair process is performed only, does not occur.

Furthermore, an edge of the bridge is removed by the FIB repair method. There is no residue left at the boundary of the bridge.

While the present invention has been described with reference to certain preferred embodiments, various other modifications will be apparent to and can be readily made by those skilled in the art without departing from the scope and spirit of the present invention.

What is claimed is:

1. A method for repairing phase shift mask in a semiconductor device by removing a bridge formed between phase shift layers on a quartz substrate, comprising the steps of:

a first repairing step to the bridge by implanting Ga ions to the bridge using a focused ion beam; and a second repairing step to the bridge by emitting a blue laser to the bridge allowing the bridge to drop off the quartz substrate, wherein the blue laser has a wavelength in the range of 400 to 500 nm.

2. The method of claim 1, wherein in the step of first repairing the bridge, the Ga ions (Ga+) are implanted such that bonding force of the entire bridge is weakened.

3. The method of claim 2, wherein the Ga ions (Ga$^+$) are implanted by energy of approximately 25~35 KeV with beam current of approximately 45~55 pA and ion concentration of $10^{15}$~$2\times10^{15}$ ions/cm$^2$.

4. A method for repairing phase shift mask in a semiconductor device by removing a bridge formed between phase shift layers on a quartz substrate, comprising the steps of:

a first repairing step to the bridge by dividing the bridge into a shape of a lattice then implanting Ga ions to the bridge using a focused ion beam; and a second repairing step to the bridge by emitting a blue laser to the bridge allowing the bridge to drop off the quartz substrate, wherein the blue laser has a wavelength in the range of 400 to 500 nm.

5. The method of claim 4, wherein the step of first repairing the bridge, a boundary between the phase shift layers and the bridge is repaired.

6. The method of claim 5, wherein a line width of the first repaired portion is shown as an integral number times of the minimum line width repairable by the FIB device.

7. The method of claim 4, wherein the Ga ions (Ga+) are implanted with a relatively high energy of 140~150 pA.

8. A repair method for phase shift mask in a semiconductor device so as to remove a bridge formed between phase shift layers on a quartz substrate, comprising the steps of:

first repairing the bridge by emitting a blue laser to a center of the bridge wherein the blue laser has a wavelength in the range of 400 to 500 nm; and second repairing the first repaired bridge by implanting charging ions according to a focused ion beam ("FIB") method.

9. The method of claim 8, wherein the step of second repairing the bridge, the Ga ions (Ga+) are implanted with energy of 20~40 KeV.

* * * * *